(12) United States Patent
Preuschl et al.

(10) Patent No.: US 9,961,781 B2
(45) Date of Patent: May 1, 2018

(54) OPTOELECTRONIC ASSEMBLY AND METHOD FOR PRODUCING AN OPTOELECTRONIC ASSEMBLY

(71) Applicant: OSRAM GmbH, Munich (DE)

(72) Inventors: Thomas Preuschl, Sinzing (DE); Robert Kraus, Regensburg (DE)

(73) Assignee: OSRAM GMBH, Munich (DE)

( * ) Notice: Subject to any disclaimer, the term of this patent is extended or adjusted under 35 U.S.C. 154(b) by 386 days.

(21) Appl. No.: 14/646,036

(22) PCT Filed: Nov. 15, 2013

(86) PCT No.: PCT/EP2013/073966
§ 371 (c)(1),
(2) Date: May 20, 2015

(87) PCT Pub. No.: WO2014/079784
PCT Pub. Date: May 30, 2014

(65) Prior Publication Data
US 2015/0330616 A1  Nov. 19, 2015

(30) Foreign Application Priority Data

Nov. 20, 2012  (DE) .................. 10 2012 221 229

(51) Int. Cl.
*H01L 21/00* (2006.01)
*H05K 3/34* (2006.01)
(Continued)

(52) U.S. Cl.
CPC ............. *H05K 3/341* (2013.01); *F21K 9/20* (2016.08); *F21V 3/02* (2013.01); *F21V 19/001* (2013.01);
(Continued)

(58) Field of Classification Search
CPC ............... F21V 19/0035; F21V 19/001; F21V 23/001–23/006; F21K 9/00–9/90
See application file for complete search history.

(56) References Cited

U.S. PATENT DOCUMENTS

2008/0123341 A1  5/2008  Chiu

FOREIGN PATENT DOCUMENTS

| EP | 2503214 A1 | 9/2012 |
|---|---|---|
| WO | 2007108600 A1 | 9/2007 |

(Continued)

OTHER PUBLICATIONS

International Search Report based on application No. PCT/EP2015/073966 (6 pages + 3 pages of English translation) dated Mar. 4, 2014.

*Primary Examiner* — Syed Gheyas
(74) *Attorney, Agent, or Firm* — Viering, Jentschura & Partner mbB (57) ABSTRACT

An optoelectronic assembly may include a substrate, which has a first contact region at a first side thereof, an optoelectronic component arranged on the first side of the substrate, which has a first contact coupled to the first contact region, a printed circuit board with conductor tracks, which is coupled to the first side of the substrate at a first side of the printed circuit board and which has a central cutout, in which the optoelectronic component is exposed, and which has a first contact cutout, which overlaps the first contact region, at least one electronic component arranged on a second side of the printed circuit board, which is coupled to the conductor tracks, and a connection element, which is arranged in the first contact cutout and electrically couples the first contact region to the conductor tracks, wherein the connection element fixes the substrate to the printed circuit board.

13 Claims, 4 Drawing Sheets

(51) Int. Cl.
*H05K 3/36* (2006.01)
*F21V 3/02* (2006.01)
*F21V 19/00* (2006.01)
*F21V 23/00* (2015.01)
*F21K 9/20* (2016.01)
*F21Y 115/10* (2016.01)

(52) U.S. Cl.
CPC ............ *F21V 23/006* (2013.01); *H05K 3/36* (2013.01); *F21Y 2115/10* (2016.08); *Y10T 29/49128* (2015.01)

(56) References Cited

FOREIGN PATENT DOCUMENTS

| | | |
|---|---|---|
| WO | 2011043441 A1 | 4/2011 |
| WO | 2012055852 A1 | 5/2012 |

OPTOELECTRONIC ASSEMBLY AND METHOD FOR PRODUCING AN OPTOELECTRONIC ASSEMBLY

RELATED APPLICATIONS

The present application is a national stage entry according to 35 U.S.C. § 371 of PCT application No.: PCT/EP2013/073966 filed on Nov. 15, 2013, which claims priority from German application No.: 10 2012 221 229.9 filed on Nov. 20, 2012, and is incorporated herein by reference in its entirety.

TECHNICAL FIELD

Various embodiments may relate to an optoelectronic assembly and to a method for producing an optoelectronic assembly.

BACKGROUND

A conventional optoelectronic assembly may include for example a housing, a printed circuit board, an electronic component arranged on the printed circuit board, a carrier and/or an optoelectronic component arranged on the carrier on a substrate, for example in the form of a subgroup ("submount"). The housing serves for example as protection for the electronic component, for electrically conductive conductor tracks of the printed circuit board and/or terminals of the optoelectronic assembly against external effects, such as, for example, impacts and/or moisture. The housing can be fixed to the printed circuit board and/or the carrier for example by adhesive bonding and/or a plug connection or latching connection. In order to improve the protection against moisture, by way of example, a sealing body, such as, for example, a silicone cap, can be arranged between the housing and the printed circuit board and/or the electronic component. The carrier can serve for example for carrying the printed circuit board and/or the substrate with the optoelectronic component and/or as a heat sink and/or for stabilizing the optoelectronic assembly.

The optoelectronic component of the subgroup can have for example between 1 and 500 LEDs, for example between 100 and 200 LEDs, which can be electrically coupled to one another, for example. Furthermore, the subgroup may include the substrate, for example a ceramic substrate and/or a metal substrate, on which the LEDs are arranged. Furthermore, the optoelectronic component may include a conversion layer for converting electromagnetic radiation generated by the LEDs. The conversion layer can be formed for example by a silicone layer including phosphor. The substrate with the optoelectronic component can be fixed for example on the carrier, for example by an adhesive, for example a thermal adhesive. The thermal adhesive can for example be applied to the carrier and/or the optoelectronic component in a dispensing method and/or be dried and/or cured at 100° to 200° C.

The printed circuit board can be formed for example on the carrier. For example, layers of the printed circuit board can be laminated onto the carrier. The optoelectronic component can be electrically contacted with the printed circuit board, for example with the conductor tracks of the printed circuit board, for example via the substrate by electrically insulated wires.

After completion, the optoelectronic assembly can then be mounted for its part on a mounting surface, for example by clipping, screwing, riveting or the like. For fixing by screwing, for example, mounting cutouts can be provided in the optoelectronic assembly, which mounting cutouts can extend for example through the housing, the carrier and the printed circuit board. Furthermore, the mounting cutouts can be reinforced by sleeves in order to be able to take up the mechanical loads, such as, for example, pressure or stress forces, during mounting.

The optoelectronic assembly can for example comply with the Zhaga standard and/or fulfill the Zhaga standard. Clearly defined interface specifications, for example, are stipulated in the Zhaga standard. This ensures the interchangeability of LED light sources from different manufacturers.

SUMMARY

In various embodiments, an optoelectronic assembly is provided which is producible simply, rapidly and/or cost-effectively and/or in which an optoelectronic component of the optoelectronic assembly is electrically contactable simply, rapidly and/or cost-effectively.

In various embodiments, a method for producing an optoelectronic assembly is provided which is implementable simply, rapidly and/or cost-effectively and/or in which an optoelectronic component of the optoelectronic assembly is electrically contactable simply, rapidly and/or cost-effectively.

In various embodiments, an optoelectronic assembly is provided. The optoelectronic assembly includes a substrate. The substrate has a first contact region at a first side of the substrate. An optoelectronic component is arranged on the first side of the substrate and has a first contact, which is electrically coupled to the first contact region. A printed circuit board has conductor tracks and is physically coupled to the first side of the substrate at a first side of the printed circuit board. The printed circuit board has a central cutout, in which the optoelectronic component is exposed, and a first contact cutout, which overlaps the first contact region. At least one electronic component is arranged on a second side of the printed circuit board, facing away from the first side of the printed circuit board, and is electrically coupled to at least one of the conductor tracks. An electrically conductive first connection element is arranged in the first contact cutout and electrically couples the first contact region to at least one of the conductor tracks. The connection element fixes the substrate to the printed circuit board.

The contact cutout of the printed circuit board, which contact cutout is arranged above the contact region of the substrate, and the connection element, which is arranged in the contact cutout and which electrically contacts the electronic component and/or the conductor track through the printed circuit board to the contact region for the purpose of contacting the optoelectronic component, contribute to simple, rapid and cost-effective production of the optoelectronic assembly and/or to simple, rapid and cost-effective electrical contacting of the optoelectronic component. For example, it is possible to dispense with wires, for example bonding wires or insulated wires for electrically coupling the optoelectronic component to the printed circuit board. Furthermore, the subgroup ("submount"), in particular the substrate, without a carrier, for example without an aluminum carrier, can be coupled to the printed circuit board. In other words, the subgroup with the optoelectronic component can be directly physically coupled to the printed circuit board and/or the carrier can be dispensed with. The substrate serves for example for directly arranging chips, for example semiconductor chips, for example LEDs, on the substrate.

The substrate can have a second contact region for example at the first side of the substrate. The optoelectronic component can have a second contact, which is electrically coupled to the second contact region. The printed circuit board can have a second contact cutout, which overlaps the second contact region. An electrically conductive second connection element can be arranged in the second contact cutout and electrically couple the second contact region to at least one of the conductor tracks. The second connection element can fix the substrate to the printed circuit board.

In accordance with various embodiments, the optoelectronic assembly includes a housing, which covers at least one part of the second side of the printed circuit board and the electronic component. The housing has a central cutout of the housing, in which the optoelectronic component is exposed. The housing can have for example a mounting cutout of the housing for the purpose of fixing the optoelectronic assembly. The printed circuit board can have a mounting cutout of the printed circuit board, which at least partly overlaps the mounting cutout of the housing. For example, the mounting cutouts of the housing and of the printed circuit board can be formed concentrically and/or with an identical radius. The mounting cutouts enable simple mounting of the optoelectronic assembly, for example on a mounting surface. The housing can be produced in an injection-molding method, for example.

In accordance with various embodiments, a wall of the mounting cutout of the housing extends through the mounting cutout of the printed circuit board and alongside the substrate as far as a second side of the substrate, facing away from the first side of the substrate. In other words, an end section of the wall of the mounting cutout of the housing can be flush with the second side of the substrate. By way of example, the second side of the substrate and the end section of the wall of the mounting cutout of the housing can form an underside of the optoelectronic assembly, wherein the optoelectronic assembly emits electromagnetic radiation at a top side of the optoelectronic assembly facing away from the underside. The wall of the mounting cutout of the housing that extends as far as the second side of the substrate can contribute to the fact that the mounting of the optoelectronic assembly is associated with the action of a low level of mechanical stress, for example bending forces, on the optoelectronic assembly, for example the substrate and/or the printed circuit board.

In accordance with various embodiments, the printed circuit board has a mounting cutout of the printed circuit board and the substrate has a mounting cutout of the substrate, which overlaps the mounting cutout of the printed circuit board. Furthermore, the mounting cutout of the printed circuit board and of the substrate overlap the mounting cutout of the housing. By way of example, all overlapping mounting cutouts are formed concentrically and/or with an identical radius. By way of example, the overlapping mounting cutouts form a continuous mounting cutout of the optoelectronic assembly. The mounting cutout of the substrate can contribute to being able to dispense with the wall of the mounting cutout of the housing that extends as far as toward the second side of the substrate, and to the fact that nevertheless the mounting of the optoelectronic assembly is associated with the action of a low level of mechanical stress, for example bending forces, on the optoelectronic assembly, for example the substrate and/or the printed circuit board.

In accordance with various embodiments, a sleeve is arranged in the mounting cutout of the housing. The sleeve may include or be formed from a metal or a hard plastic, for example. The sleeve can take up forces which arise during mounting, for example on account of a screw connection, thereby relieving the burden on the housing. If the wall of the mounting cutout of the housing extends as far as toward the second side of the substrate, then the sleeve can also extend as far as toward the second side of the substrate. If the mounting cutout of the substrate is formed, then the sleeve can extend as far as through the mounting cutout of the printed circuit board and/or as far as through the mounting cutout of the substrate.

In accordance with various embodiments, the housing has a fixing pin and the printed circuit board has a fixing cutout. At least one section of the fixing pin is arranged in the fixing cutout. The section of the fixing pin and the fixing cutout are formed with a press fit with respect to one another. The fixing pin and the fixing cutout can contribute to fixing the housing to the printed circuit board simply and rapidly.

In accordance with various embodiments, the connection element includes solder. The solder can be introduced into the contact cutouts in a simple manner. Furthermore, the solder can be melted in a simple manner, for example by local heating of the substrate and/or of the solder. The solder can contribute in a simple manner to producing the electrical and physical connection between the contact regions and the conductor tracks and/or the electronic component.

In various embodiments, a method for producing an optoelectronic assembly is provided. The method involves firstly providing, for example forming, a printed circuit board having conductor tracks, a central cutout and a first contact cutout. At least one electronic component is arranged on the second side of the printed circuit board, facing away from the first side of the printed circuit board, and is electrically coupled to at least one conductor track of the printed circuit board. The substrate is provided, which has the first contact region at the first side of the substrate. The optoelectronic component is arranged on the first side of the substrate and a first contact of the optoelectronic component is electrically coupled to the first contact region. The printed circuit board is physically coupled to the first side of the substrate at a first side of the printed circuit board such that the optoelectronic component is exposed in the central cutout of the printed circuit board and the first contact cutout overlaps the first contact region. The electrically conductive first connection element is arranged in the first contact cutout such that it electrically couples the first contact region to at least one of the conductor tracks. The substrate is fixed to the printed circuit board with the aid of the connection element.

In accordance with various embodiments, solder is used for the connection element. In other words, the connection element is formed by the solder.

In accordance with various embodiments, the connection element is introduced into the contact cutout and the connection element for the purpose of electrically contacting the contact regions to the conductor track and for the purpose of fixing the substrate to the printed circuit board is heated. By way of example, the solder can be introduced into the contact cutout in a dispensing method. The solder may include tin and/or copper, for example.

In accordance with various embodiments, the connection element is heated selectively. By way of example, the solder can be heated selectively. In other words, the solder can be heated locally, such that the surrounding component parts, such as, for example, the substrate or the printed circuit board, merely heat up locally in the vicinity of the connection element and/or the electronic component and/or the optoelectronic component merely heat up slightly or do not heat up at all. The selective soldering process can be carried out by a laser, for example, which is directed at the connection element to be heated, for example.

In accordance with various embodiments, the connection element is heated inductively, by microwave radiation and/or by a laser beam.

In accordance with various embodiments, the substrate is fixed, for example secured, to the printed circuit board by an adhesive. This can contribute to mechanical stress that possibly occurs being advantageously distributed between the printed circuit board and/or the substrate.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, in so far as this is expedient.

An optoelectronic assembly may include one, two or more optoelectronic components. Optionally, an optoelectronic assembly may also include one, two or more electronic components.

An electronic component may include for example an active and/or a passive electronic component. An active electronic component may include for example a computing, control and/or regulating unit and/or a transistor. A passive electronic component may include for example a capacitor, a resistor, a diode or a coil.

In various embodiments, an optoelectronic component may include an electromagnetic radiation emitting component or an electromagnetic radiation absorbing component. An electromagnetic radiation absorbing component can be a solar cell, for example. In various embodiments, an electromagnetic radiation emitting component can be an electromagnetic radiation emitting semiconductor component and/or be embodied as an electromagnetic radiation emitting diode, as an organic electromagnetic radiation emitting diode, as an electromagnetic radiation emitting transistor or as an organic electromagnetic radiation emitting transistor. The radiation can be for example light in the visible range, UV light and/or infrared light. In this context, the electromagnetic radiation emitting component can be embodied for example as a light emitting diode (LED), as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing. Furthermore, the optoelectronic component can have a substrate, on which the electromagnetic radiation emitting component or electromagnetic radiation absorbing component is arranged.

An optoelectronic component having one, two or more chips, for example semiconductor chips, and a substrate, on which the optoelectronic component is arranged, can be designated for example as a subgroup ("submount").

Figure 1:
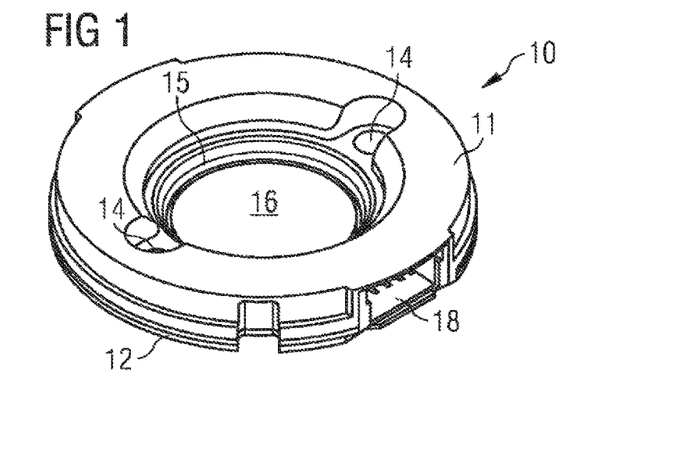
FIG. 1 shows one embodiment of an optoelectronic assembly.

FIG. 1 shows a perspective illustration of one embodiment of an optoelectronic assembly 10. The optoelectronic assembly 10 can be embodied for example in accordance with the Zhaga standard. The optoelectronic assembly 10 includes a housing 11, a printed circuit board 12 and an optoelectronic component 16. The optoelectronic component 16 is fixed in a central cutout 15 of the housing 11. The optoelectronic component 16 can emit electromagnetic radiation through the central cutout 15 of the housing 11. The printed circuit board 12 can have for example a plurality of electrically conductive conductor tracks. The printed circuit board 12 can be for example a conventional printed circuit board, for example an FR1, FR2, FR3, FR4, FR5, CEM1, CEM2, CEM3, CEM4 or CEM5 printed circuit board, for example a through-contacted FR-4 printed circuit board.

The housing 11 has two mounting cutouts 14 of the housing 11. Alternatively, the housing 11 can also have just one or more mounting cutouts 14 of the housing 11. The optoelectronic assembly 10 can be fixed for example by the mounting cutouts 14 of the housing 11, for example on a mounting surface (not illustrated). The fixing can be effected for example by fixing means, for example by screws.

The optoelectronic assembly 10 includes a plug element 18 (also designated as plug connector element), which can serve for example for electrically contacting the optoelectronic assembly 10. For example, the optoelectronic assembly 10 can be supplied with energy and/or controlled or regulated by the plug element 18.

Figure 2:
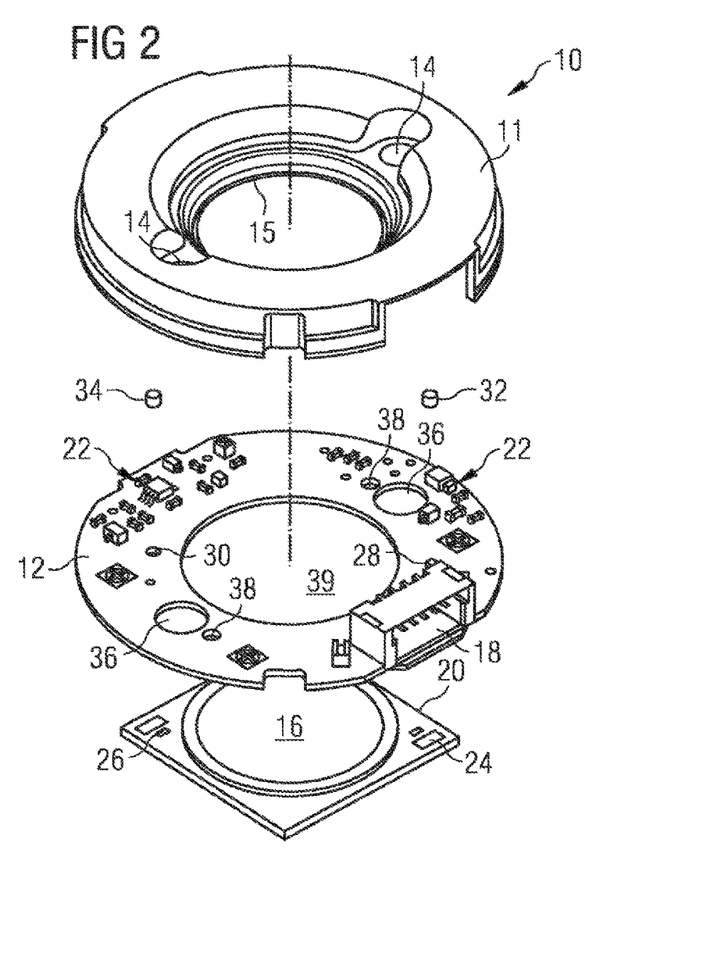
FIG. 2 shows an exploded illustration of the optoelectronic assembly in accordance with FIG. 1.

FIG. 2 shows an exploded illustration of the optoelectronic assembly 10 in accordance with FIG. 1. The optoelectronic assembly 10 includes a substrate 20, on which one, two or more chips, for example semiconductor chips, for example LEDs, are arranged. A first contact region 24 and/or a second contact region 26 for electrically contacting the optoelectronic component 16 are formed on the substrate 20.

Optionally, the optoelectronic component 16 may include a conversion layer. The conversion layer can be arranged for example on a side of the semiconductor chip or semiconductor chips that faces away from the substrate 20. The conversion layer can serve for example for converting electromagnetic radiation generated by the chips, for example with regard to its wavelengths. By way of example, the conversion layer may include a silicone layer including phosphor.

For example, one, two or more electronic components 22 are arranged on the printed circuit board 12. Furthermore, the electronic components 22 are electrically coupled to the conductor tracks of the printed circuit board 12. The electronic components 22 may include for example passive or active electronic components. The active electronic components may include for example a control and/or regulating unit and/or a transistor. The passive electronic components may include for example a resistor, a capacitor and/or a coil. The electronic components 22 can be electrically coupled to the plug element 18 for example by the conductor tracks (not illustrated) of the printed circuit board 12.

The printed circuit board 12 has a first contact cutout 28 and/or a second contact cutout 30 and/or a central cutout 39 of the printed circuit board 12. The first contact cutout 28 forms an overlap region with the first contact region 24 when the printed circuit board 12 is arranged as intended on the substrate 20. In other words, the first contact cutout 28 and the first contact region 24 overlap. The second contact cutout and the second contact region 26 form a further overlap region, if appropriate. In other words, the second contact cutout 30 and the second contact region 26 overlap.

A first connection element 32 can be arranged in the first contact cutout 28. If appropriate, a second connection element can be arranged in the second contact cutout 30. The connection elements 32, 34 are embodied in an electrically conductive fashion. The connection elements 32, 34 serve for electrically coupling the corresponding contact region 24, 26 to the electronic components 22, the optoelectronic component and/or the plug element 18, for example by the conductor tracks of the printed circuit board 12. Furthermore, the corresponding connection elements 32, 34 serve for physically fixing the substrate 20 to the printed circuit board 12. The printed circuit board 12 can be fixed directly to the substrate 20 of the optoelectronic component 16.

The printed circuit board 12 has mounting cutouts 36 of the printed circuit board 12, which overlap the corresponding mounting cutouts 14 of the housing 11 when the housing 11 is arranged as intended on the printed circuit board 12. By way of example, the mounting cutouts 36 of the printed circuit board 12 can be formed concentrically with the mounting cutouts 14 of the housing 11 and/or have the same radius.

Optional fixing cutouts 38 are formed in the printed circuit board 12, said fixing cutouts interacting with optional fixing pins (not illustrated) formed on the housing 11. By way of example, the fixing pins 11 can be fixed by a press fit in the fixing cutouts 38, as a result of which the housing 11 can be fixed to the printed circuit board 12 in a simple manner.

Figure 3:
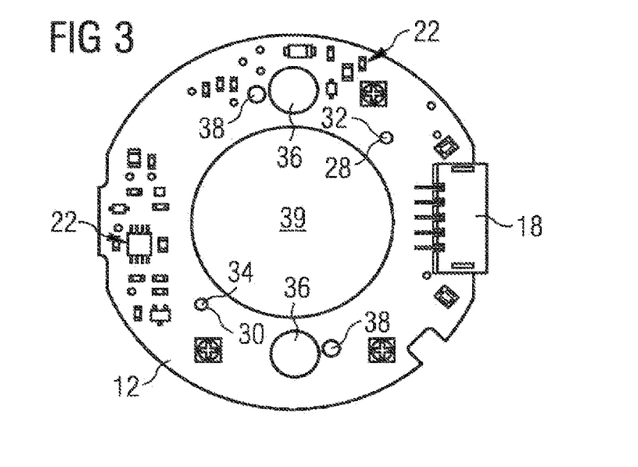
FIG. 3 shows a plan view of one embodiment of a printed circuit board.

FIG. 3 shows a plan view of one embodiment of a printed circuit board 12, which may largely correspond to the printed circuit board 12 explained above. The connection elements 32, 34 are arranged in the printed circuit board 12, for example in the contact cutouts 28, 30. In this embodiment, the printed circuit board 12 is embodied in a substantially circular fashion. As an alternative thereto, the printed circuit board 12 can be embodied for example in a polygonal, rectangular or square fashion.

Figure 4:
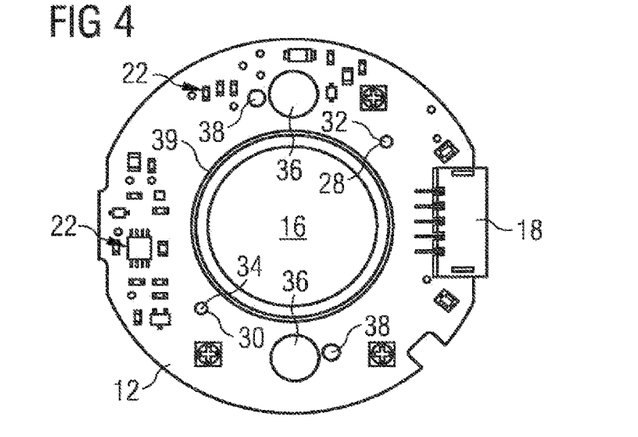
FIG. 4 shows a plan view of the printed circuit board in accordance with FIG. 3 and one embodiment of an optoelectronic component.

FIG. 4 shows the printed circuit board in accordance with FIG. 3 in plan view with one embodiment of an optoelectronic component 16, wherein the optoelectronic component 16 may largely correspond to the optoelectronic component 16 shown in FIG. 2. The sides of the printed circuit board 12 and of the optoelectronic component 16 which are shown in FIG. 4 can be designated as top side of the printed circuit board 12 and of the optoelectronic component 16, respectively. An electromagnetic radiation emitting region of the optoelectronic component 16 is arranged in the central cutout 39 of the printed circuit board 12. By way of example, electromagnetic radiation emitting components of the optoelectronic component 16 are arranged in the central cutout 39 of the printed circuit board 12. Furthermore, if appropriate, the conversion layer for converting the electromagnetic radiation with regard to its wavelength can be arranged in the central cutout 39 of the printed circuit board. Furthermore, the electromagnetic radiation emitting components of the optoelectronic component 16 can be arranged above or below the central cutout 39 of the printed circuit board 12.

Figure 5:
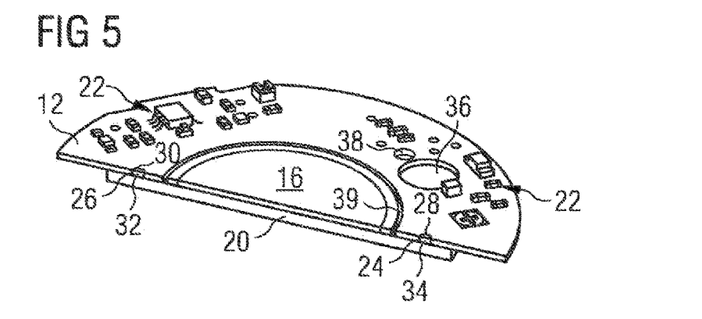
FIG. 5 shows a perspective sectional illustration of the printed circuit board and of the optoelectronic component in accordance with FIG. 4 with one embodiment of a substrate.

FIG. 5 shows a perspective sectional illustration of the printed circuit board 12, of the substrate 20 and of the optoelectronic component 16 in accordance with FIG. 4. The substrate 20 is directly physically coupled to the connection elements 32, 34, specifically in the first and second contact regions 24, 26, respectively. By way of example, the connection elements 32, 34 can form a solder connection between the printed circuit board 12 and the substrate 20, for example the first and second contact regions 24, 26, respectively. A first side of the substrate 20 faces a first side of the printed circuit board 12. By way of example, the substrate 20 and the printed circuit board 12 are in direct physical contact with one another at their first sides.

Figure 6:
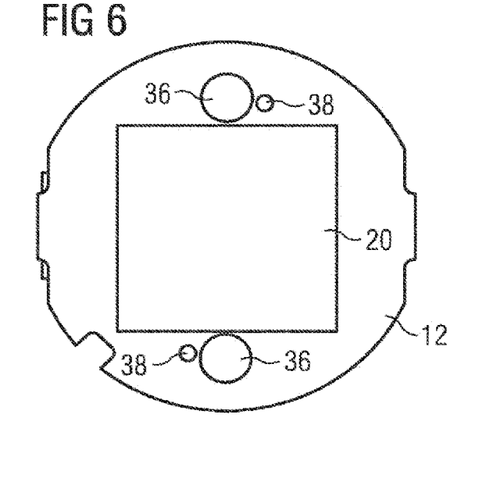
FIG. 6 shows a plan view of an underside of the printed circuit board with the optoelectronic component in accordance with FIG. 5.

FIG. 6 shows a plan view of an underside of one embodiment of an optoelectronic assembly 10, which may largely correspond to one of the optoelectronic assemblies 10 described above. The underside of the optoelectronic assembly 10 is formed by an underside of the printed circuit board 12 and an underside of the substrate 20. The undersides of the printed circuit board 12 and of the substrate 20 face away from the top sides of the printed circuit board 12 and of the substrate 20. The underside of the subgroup with the optoelectronic component 16 is formed by the underside of the substrate 20. The underside of the substrate 20 can for example be designated as the second side of the substrate 20 and/or faces away from the first side of the substrate 20.

The substrate 20 is embodied in a square fashion. As an alternative thereto, the substrate 20 can also be embodied differently, for example as polygonal, for example rectangular, or for example roundish, for example oval or circular. The substrate 20 is embodied with respect to the mounting cutouts of the printed circuit board 12 such that the mounting cutouts 36 of the printed circuit board 12 and the substrate 20 form no overlap region.

Figure 7:
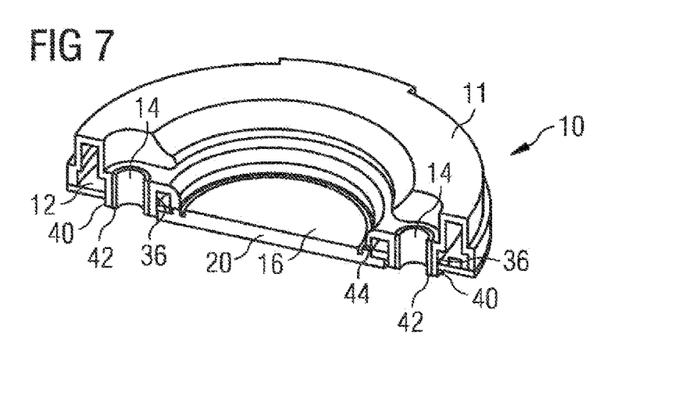
FIG. 7 shows a sectional illustration of one embodiment of an optoelectronic component.

FIG. 7 shows a perspective sectional illustration of one embodiment of an optoelectronic assembly 10, which may largely correspond to one of the optoelectronic assemblies 10 explained above. The underside of the optoelectronic assembly 10 is embodied in a manner corresponding to the underside of the optoelectronic assembly 10 in accordance with FIG. 6. The mounting cutouts 14 of the housing 11 are embodied in such a way that walls 40 of the mounting cutouts 14 of the housing 11 extend through the mounting cutouts 36 of the printed circuit board 12, for example as far as the underside of the substrate 20.

Optionally, sleeves 42 can be arranged in the mounting cutouts 14 of the housing 11. The sleeves 42 may for example include metal or be formed therefrom. The sleeves can contribute to compensating for a mechanical stress that occurs during the fixing of the optoelectronic assembly 10, for example an acting pressure, and/or to diverting it from the housing 11.

The walls 40 extending as far as the second side of the substrate 20 and/or the sleeves 42 can contribute in a simple manner to preventing mechanical stress from arising for the printed circuit board 12 and/or the substrate 20 during the fixing of the optoelectronic assembly 10.

Alternatively or additionally, the housing 11 can be embodied such that it has a pressure region 44, which is embodied for example such that in the pressure region 44 there is a direct physical contact between the housing and the substrate 20 or that in the pressure region 44 the housing 11 presses the printed circuit board 12 against the substrate 20.

Figure 8:
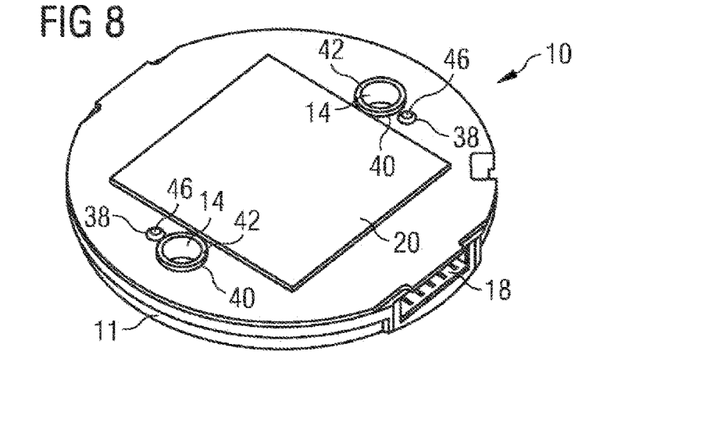
FIG. 8 shows a perspective view of an underside of one embodiment of an optoelectronic assembly.

FIG. 8 shows a perspective view of the underside of the optoelectronic assembly 10, which may largely correspond to one of the optoelectronic assemblies 10 explained above, for example the optoelectronic assembly 10 explained with reference to FIG. 7.

Figure 9:
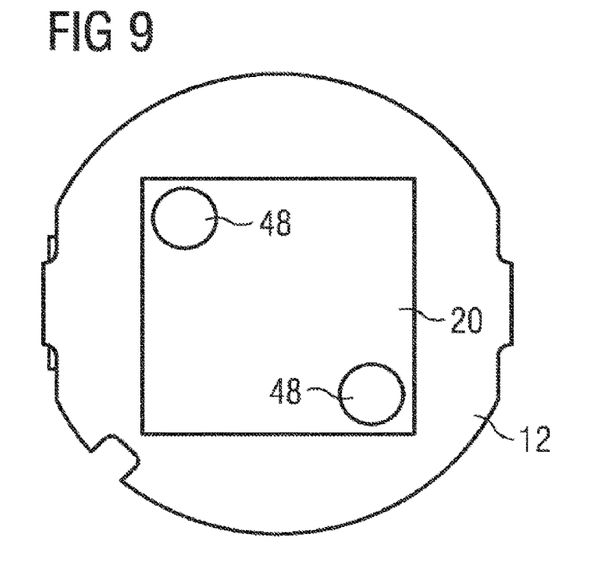
FIG. 9 shows a plan view of an underside of one embodiment of an optoelectronic assembly.

FIG. 9 shows a plan view of undersides of one embodiment of a printed circuit board 12 and one embodiment of the substrate 20. The printed circuit board 12 and the substrate 20 are embodied and arranged with respect to one another such that the substrate 20 has mounting cutouts 48 of the substrate 20, which overlap for example the mounting cutouts 36 of the printed circuit board 12. Consequently, the mounting cutouts 14 of the housing 11, the mounting cutouts 36 of the printed circuit board 12 and the mounting cutouts 48 of the substrate 20 form common mounting cutouts of the optoelectronic assembly 10. This may contribute to being able to dispense with the walls 40 of the mounting cutouts 14 of the housing 11 that extend as far as the underside of the substrate 20, and/or the sleeves 42, and nevertheless to preventing a mechanical stress from acting on the printed circuit board 12 and/or the substrate 20 during the fixing of the optoelectronic assembly 10 to the mounting surface. The mechanical stress may possibly have the effect that the printed circuit board 12 and/or the substrate 20 are/is bent.

Figure 10:
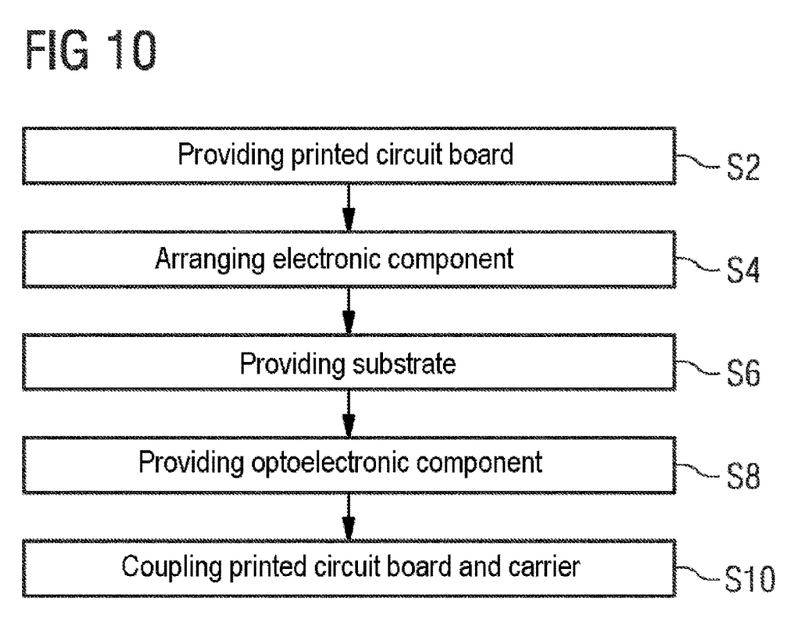
FIG. 10 shows a flowchart of one embodiment of a method for producing an optoelectronic assembly.

FIG. 10 shows a flowchart of one embodiment of a method for producing an optoelectronic assembly, for example one of the optoelectronic assemblies 10 explained above.

A step S2 involves providing, for example forming, a printed circuit board, for example the printed circuit board 12 explained above. The printed circuit board 12 can be formed for example with the conductor tracks, the contact cutouts 28, 30, the mounting cutouts 36, the central cutout 39 and/or the fixing cutouts 38.

A step S4 involves arranging one, two or more electronic components, for example the electronic components 22 explained above, on the printed circuit board 12. By way of example, the electronic components 22 can be physically and/or electrically connected to the printed circuit board 12, for example the conductor tracks of the printed circuit board 12. The electrical and/or physical connection can be produced for example by one or a plurality of solder connections.

A step S6 involves providing a substrate, for example the substrate 20 explained above. The substrate 20 can be for example a plastic substrate, a ceramic substrate or a metal substrate.

A step S8 involves providing an optoelectronic component, for example the optoelectronic component 16 explained above, and/or arranging it on the substrate 20. Furthermore, two, three or more optoelectronic components 16 can be provided. For example, one, two or more chips, for example semiconductor chips, can be arranged or formed on the substrate 20. Furthermore, the contact regions 24, 26 can be formed on the substrate 20 and can be electrically coupled to the optoelectronic component 16, for example the chips.

A step S10 involves electrically and/or physically coupling the printed circuit board 12 and the substrate 20 to one another, for example with the aid of the connection elements 32, 34. The connection elements 32, 34 are introduced into the contact cutouts 28, 30 for the purpose of electrically contacting the contact regions 24, 26 to the conductor tracks and for the purpose of fixing the substrate 20 to the printed circuit board 12 and are heated. In this regard, the solder can be introduced into the contact cutouts 28, 30 in a dispensing method. The solder may include tin and/or copper.

The connection elements 32, 34 can be heated selectively. In this regard, the solder can be heated selectively. In other words, the solder can be heated locally, such that the surrounding components, such as, for example, the substrate 20 or the printed circuit board 12, merely heat up locally in the vicinity of the connection elements 32, 34 and/or the electronic component 32 and/or the optoelectronic component 16 merely heat up slightly or do not heat up at all. The selective soldering process can be carried out by a laser directed at the connection element 32, 34 to be heated. Alternatively or additionally, the connection elements can be heated inductively, by microwave radiation and/or by a laser beam. Furthermore, the substrate 20 can be preheated. In addition, the substrate 20 can be fixed, for example secured, to the printed circuit board 12 by an adhesive. This can contribute to advantageously distributing mechanical stress that possibly occurs between the printed circuit board 12 and/or the substrate 20.

The disclosure is not restricted to the embodiments indicated. By way of example, the outer form of the optoelectronic assembly 10 can deviate from the form illustrated. Furthermore, in all of the embodiments, one, two or more contact regions 24, 26, contact cutouts 28, 30 and/or connection elements 32, 34 can be arranged. Alternatively or additionally, the optoelectronic component 16 can have further electrical contacts. In all of the embodiments, the contact regions 24, 26 can be arranged symmetrically or asymmetrically. Furthermore, as an alternative or in addition to soldering, the electrical and/or physical connections explained above can also be formed by welding, for example by a welding current, and/or by one, two or more spring elements. Furthermore, in all of the embodiments, more optoelectronic components 16 can be arranged. For example, an optoelectronic component 16 may include a multiplicity of light emitting chips, for example semiconductor chips. Furthermore, more or fewer mounting cutouts can be provided. Furthermore, all embodiments can have the fixing pins and the fixing cutouts corresponding thereto. As an alternative thereto, in all of the embodiments, the fixing pins and fixing cutouts can be dispensed with and/or the housing 11 can be fixed to the printed circuit board 12 for example by an adhesive and/or an adhesive-bonding connection. Furthermore, one, two or more further components, for example a surface mounted device (SMD), can be arranged on the substrate 20, wherein the printed circuit board 12 can then correspondingly have one, two or more further cutouts, in which for example the corresponding components can be arranged.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic assembly, comprising:
   a substrate, which has at least one first contact region at a first side of the substrate,
   an optoelectronic component, which is arranged on the first side of the substrate and which has a first contact electrically coupled to the first contact region, a printed circuit board, which has conductor tracks and which is physically coupled to the first side of the substrate at a first side of the printed circuit board and which has a central cutout, in which the optoelectronic component is exposed, and which has a first contact cutout, which overlaps the first contact region, at least one electronic component which is arranged on a second side of the printed circuit board, facing away from the first side of the printed circuit board, and which is electrically coupled to at least one of the conductor tracks, and an electrically conductive first connection element, which is arranged in the first contact cutout and electrically couples the first contact region to at least one of the conductor tracks, wherein the connection element mechanically fixes the substrate to the printed circuit board.

2. The optoelectronic assembly as claimed in claim 1, further comprising a housing, which covers at least one part of the second side of the printed circuit board, which has a central cutout of the housing, the optoelectronic component being exposed in said central cutout, and which has a mounting cutout of the housing for the purpose of fixing the optoelectronic assembly, wherein the printed circuit board has a mounting cutout of the printed circuit board, which at least partly overlaps the mounting cutout of the housing.

3. The optoelectronic assembly as claimed in claim 2, wherein a wall of the mounting cutout of the housing extends through the mounting cutout of the printed circuit board and alongside the substrate as far as a second side of the substrate, facing away from the first side of the substrate.

4. The optoelectronic assembly as claimed in claim 2, wherein the printed circuit board has a mounting cutout of the printed circuit board and wherein the substrate has a mounting cutout of the substrate, which overlaps the mounting cutout of the printed circuit board.

5. The optoelectronic assembly as claimed in claim 2, wherein a sleeve is arranged in the mounting cutout of the housing.

6. The optoelectronic assembly as claimed in claim 2, wherein the housing has a fixing pin and the printed circuit board has a fixing cutout, wherein at least one section of the fixing pin is arranged in the fixing cutout and wherein the section of the fixing pin and the fixing cutout are embodied with a press fit with respect to one another.

7. The optoelectronic assembly as claimed in claim 1, wherein the connection element comprises solder.

8. A method for producing an optoelectronic assembly, comprising:
   providing a printed circuit board, which has a first side, a second side facing away from the first side, conductor tracks, a central cutout of the printed circuit board, a first contact cutout,
   arranging at least one electronic component on the second side of the printed circuit board and electrically coupling to at least one conductor track of the printed circuit board,
   providing a substrate, which has a first contact region at a first side of the substrate,
   arranging an optoelectronic component on the first side of the substrate and electrically coupling a first contact of the optoelectronic component to the first contact region,
   physically coupling the printed circuit board to the first side of the substrate at a first side of the printed circuit board such that the optoelectronic component is exposed in the central cutout of the printed circuit board and the first contact cutout overlaps the first contact region, and
   arranging an electrically conductive first connection element in the first contact cutout such that it electrically couples the first contact region to at least one of the conductor tracks, wherein the substrate is mechanically fixed to the printed circuit board with the aid of the connection element.

9. The method as claimed in claim 8, wherein solder is used for the connection element.

10. The method as claimed in claim 8, wherein the connection element is introduced into the contact cutout and the connection element is heated for the purpose of electrically contacting the contact region to the conductor track and for the purpose of fixing the substrate to the printed circuit board.

11. The method as claimed in claim 10, wherein the connection element is selectively heated.

12. The method as claimed in claim 11, wherein the connection element is heated inductively, by microwave radiation and/or by a laser beam.

13. The method as claimed in claim 8, wherein the substrate is fixed to the printed circuit board by an adhesive.

* * * * *